United States Patent [19]

Iijima

[11] Patent Number: 5,089,951
[45] Date of Patent: Feb. 18, 1992

[54] MICROCOMPUTER INCORPORATING MEMORY

[75] Inventor: Yasuo Iijima, Yokohama, Japan

[73] Assignee: Kabushiki Kaisha Toshiba, Kawasaki, Japan

[21] Appl. No.: 266,006

[22] Filed: Nov. 2, 1988

[30] Foreign Application Priority Data

Nov. 5, 1987 [JP] Japan .............................. 62-280210
Nov. 5, 1987 [JP] Japan .............................. 62-280212

[51] Int. Cl.⁵ ...................... G06F 12/14; G06F 13/16
[52] U.S. Cl. ................................ 395/275; 364/243.3;
364/245.6; 364/246.6; 364/DIG. 1; 365/195;
395/800
[58] Field of Search .............. 364/200, 900; 235/380;
365/195

[56] References Cited

U.S. PATENT DOCUMENTS

| | | | |
|---|---|---|---|
| 4,698,750 | 10/1987 | Wilkie et al. | 364/200 |
| 4,748,557 | 5/1988 | Tamada et al. | 364/200 |
| 4,777,586 | 10/1988 | Matsubara et al. | 364/200 |
| 4,875,156 | 10/1989 | Tanagawa et al. | 364/200 |
| 4,879,645 | 11/1989 | Tamada et al. | 364/200 |
| 4,905,142 | 2/1990 | Matsubara et al. | 364/200 |

FOREIGN PATENT DOCUMENTS

0136155 4/1985 European Pat. Off. .
0215464 3/1987 European Pat. Off. .
0243873 11/1987 European Pat. Off. .

OTHER PUBLICATIONS

Proceedings of the 7th Digital Avionics Systems Conference, Fort Worth, Texas, 13-16th Oct. 1986, pp. 410-416, IEEE, New York, US; H. F. Binnendyk et al., "Enhancing the Testability of a Digital Design with a Testabilty Bus", p. 412, left-hand column, lines 10-15, 30-41, p. 415, left-hand column, lines 9-40.

Primary Examiner—Allen R. MacDonald
Assistant Examiner—Debra A. Chun
Attorney, Agent, or Firm—Cushman, Darby & Cushman

[57] ABSTRACT

A microcomputer of this invention includes an internal memory. These memories are connected to internal buses and external buses through bi-directional buffers. This microcomputer also includes a buffer controller for determining whether an access by a control section is made to the internal memory or the access is made to an external memory. When the control section accesses the internal memories, the buffer controller controls the directions of the bi-directional buffers to enable data transfer from the external to the internal bus side. When the controller accesses the external memory, bi-directional buffers are controlled to enable data transfer from the internal to the external bus side.

23 Claims, 2 Drawing Sheets

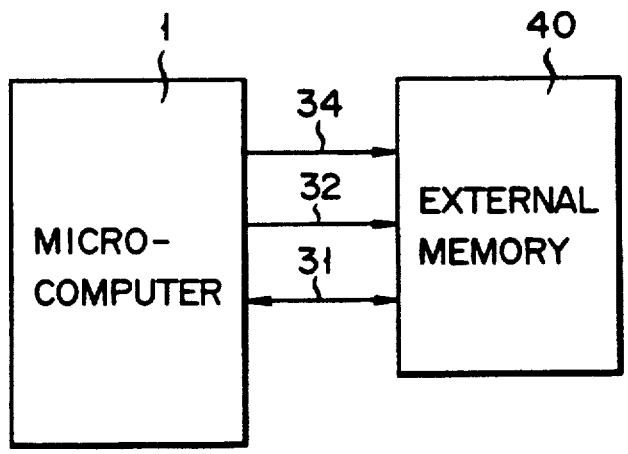
F I G. 2
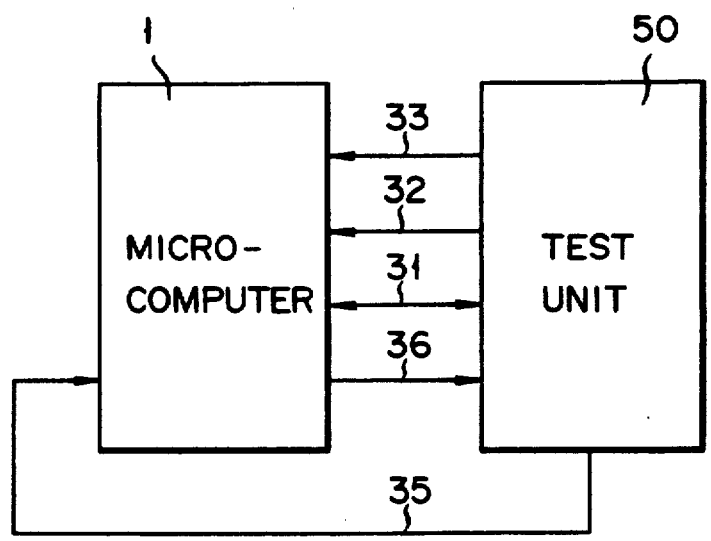
F I G. 3

MICROCOMPUTER INCORPORATING MEMORY

BACKGROUND OF THE INVENTION

1. Field of the Invention

The present invention relates to a program storage type microcomputer used in, e.g., an IC card.

2. Description of the Related Art

Among recent microcomputers, a microcomputer which incorporates a program ROM, a working RAM, and the like and allocates these memories and an external memory in the same memory space, is known. For example, in a microcomputer for accessing a 64-kbyte memory space, when the microcomputer has a 16-kbyte internal ROM, a 1-kbyte internal RAM, and a 32-kbyte external memory is used, these memories are allocated in the 64-kbyte address space without overlapping their addresses. In this case, an address and data buses are supplied from the ROM, the RAM, and the external memory, respectively.

In a conventional microcomputer, data read out from internal ROM and RAM are directly output to an external device. For this reason, ROM and RAM contents are easily recognized externally.

In particular, in a microcomputer built in an IC card or the like for which security is of prime importance, an internal ROM stores a control program. Therefore, if the program data is easily detected externally, security of the entire system suffers. In addition, a counterfeit IC card is easily manufactured.

A recent microcomputer includes a volatile memory such as a RAM as a working memory which is necessary during execution of the program. An operation of such a microcomputer, in particular, all the cell of a RAM cannot be easily confirmed. Therefore, a microcomputer has a function of writing a specific pattern and verifying and checking the pattern. However, this method does not allow perfect confirmation of the RAM operation. Therefore, when the microcomputer is easily replaceable, a test program of the RAM is input in a program of the microcomputer in advance, so that the operation of the RAM can be confirmed upon adjustment of a device which includes the microcomputer. As a result, the operation of the RAM need not be perfectly confirmed when the microcomputer is shipped.

According to the method as described above, however, a device which does not allow replacement of a microcomputer upon assembly, such as an IC card, has the following disadvantage. That is, even if an abnormality is detected in the operation of the RAM, the microcomputer cannot be replaced. Therefore, yield of IC cards is reduced, and reliability of IC cards is degraded. Therefore, in particular, when a microcomputer used as a control element of an IC card is shipped or before it is molded in the IC card, the operation of the RAM must be perfectly confirmed.

SUMMARY OF THE INVENTION

It is an object of the present invention to provide a microcomputer which allows easy external confirmation of an operation of an internal volatile memory section without inputting a test program in its program in advance, which prevents an operation, contents, and the like of internal processing from being easily recognized externally, and which is optimal for use in a device in which security is of prime importance.

In order to achieve the above object, a microcomputer of the present invention comprises: a memory for storing data; a memory access circuit for accessing the memory; and a bi-directional buffer for blocking external output of the data derived from an access operation in response to the memory access.

BRIEF DESCRIPTION OF THE DRAWINGS

Other objects and features of the present invention will be apparent from the following description taken in connection with the following figures, in which:

FIG. 2 is a block diagram showing an arrangement when the microcomputer shown in FIG. 1 is connected to an external memory; and FIG. 3 is a block diagram showing a connection relationship between a test unit and the microcomputer shown in FIG. 1 in a test mode.

DETAILED DESCRIPTION OF THE PREFERRED EMBODIMENT

Figure 1:
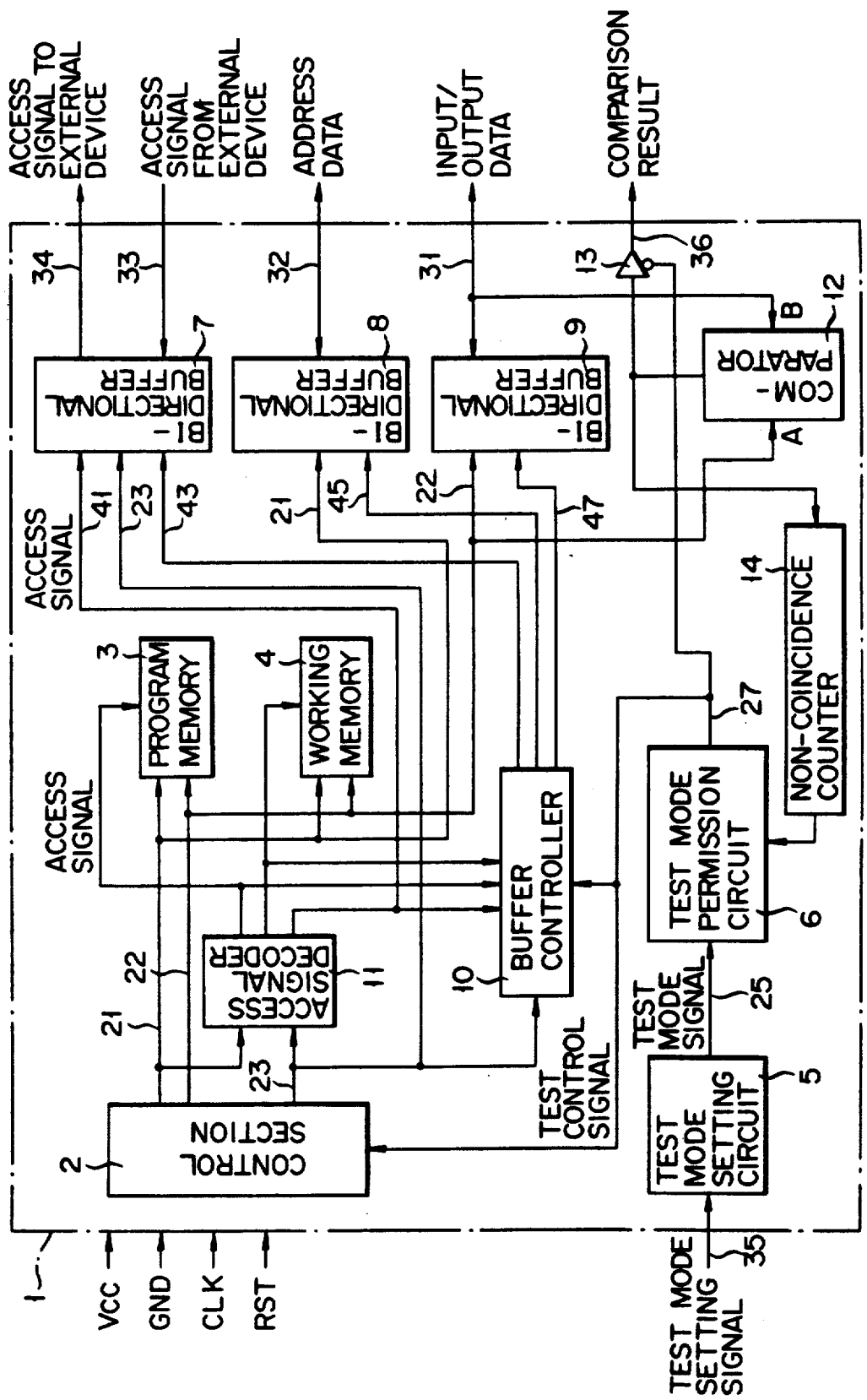
FIG. 1 is a block diagram showing a microcomputer according to an embodiment of the present invention.

FIG. 1 is a block diagram of a microcomputer of the present invention.

Microcomputer 1 includes external buses 31, 32, 33, and 34. External bus 31 is an input/output data bus. For example, as shown in FIGS. 2 and 3, external bus 31 transfers data supplied from an external unit such as external memory 40 or test unit 50 which is connected to this microcomputer 1 to internal input/output data bus 22. Bus 31 also transfers data supplied from internal input/output data bus 22 to the external unit. External bus 32 is an address bus for transferring address data supplied from the external unit to internal address bus 21, and the address data supplied from the internal address bus to the external unit. External bus 33 is an access control bus for transferring access signals (read enable (RE) signal, write enable (WE) signal, and the like) supplied from the external unit to internal access control bus 23. External bus 34 transfers an access signal output from access signal decoder 11 described later to the external unit. Bi-directional buffer 7 is connected between external buses 33 and 34, and access signal line 41, internal access control bus 23, and buffer control signal line 43. Bi-directional buffer 8 is connected between external address data bus 32, and internal address bus 21 and buffer control line 45. Bi-directional buffer 9 is connected between external input/output data bus 31, and internal data bus 22 and buffer control signal line 47. These bi-directional buffers 7, 8, and 9 are constituted by combining, e.g., two bus drivers to control data transfer directions, respectively.

Access signal line 41 connected to bi-directional buffer 7 is also connected to access signal decoder 11 and buffer controller 10. Internal access control bus 23 connected to bi-directional buffer 7 is also connected to control section 2, access signal decoder 11, and buffer controller 10. Internal address bus 21 connected to bi-directional buffer 8 is connected to control section 2, program memory 3, access signal decoder 11, and working memory 4. Internal data bus 22 connected to bi-directional buffer 9 is connected to control section 2, program memory 3, working memory 4, and comparator 12. Buffer control signal lines 43, 45, and 47 of bi-directional buffers 7, 8, and 9 are connected to buffer controller 10. Program memory 3 constituted by a mask ROM is connected to control section 2 through internal address bus 21 and internal data bus 22 and stores a program to be executed by control section 2. Working memory 4 constituted by a random access memory is connected to control section 2 through internal address bus 21 and internal data bus 22 and is used as a work area when control section 2 performs data processing. Access signal decoder 11 is connected to control section 2 through internal address bus 21 and internal access control bus 23 to generate an access signal for program, working, or external memory 3, 4, or 40 in response to address data or an address signal supplied from control section 2. The access signal output from access signal decoder 11 is also supplied to buffer controller 10. Buffer controller 10 is connected to access signal decoder 11 and control section 2 to receive internal access control data supplied from control section 2 and the access signal output from access signal decoder 11. Then, buffer controller 10 determines that the signal is an internal or external access signal, and controls directions of bi-directional buffers 7, 8, and 9 in accordance with the determination result. For example, when control section 2 read-accesses program memory 3 or working memory 4, buffer controller 10 controls the directions of bi-directional buffers 7, 8, and 9 to disable external output of the readout data. When control section 2 write-accesses external memory 40, buffer controller 10 controls the directions of bi-directional buffers 7, 8, and 9 to enable data transfer from the internal to the external bus side. When control section 2 read-accesses external memory 40, the directions of bi-directional buffers 7 and 8 are controlled to enable data transfer in the same directions as those in a write-access mode, and the direction of buffer 9 is controlled to enable data transfer in the opposite direction to that in the write-access mode. Comparator 12 is connected to external and internal input/output data buses 31 and 22 to compare data on the data buses with each other. The comparison result is output to external bus 36 through bus driver 13, and supplied to non-coincidence circuit 14. Non-coincidence circuit 14 counts non-coincidence results from comparator 12. When the number of non-coincidence results reaches a predetermined number, a carry signal is supplied to test mode permission circuit 6. Test mode permission circuit 6 is connected to test mode setting circuit 5.

Test mode setting circuit 5 receives test mode setting signal 35 externally supplied to microcomputer 1 and outputs test mode signal 25 to test mode permission circuit 6. Test mode setting circuit 5 is constituted by, e.g., a flip-flop group, a data latch circuit, and a comparator. The data latch circuit stores a specific bit pattern. An operator bit-serially inputs the specific bit pattern as test mode setting signal 35. As a result, the serially-input bit pattern is latched by the flip-flop group. Then, the bit pattern latched by the flip-flop group in response to a trigger signal is compared with the bit pattern stored in the data latch circuit by the comparator. As a result of the comparison, if the patterns coincide with each other, a coincidence signal is supplied to test mode permission circuit 6 as test mode setting signal 25. Test mode permission circuit 6 is constituted by, e.g., gates. When a carry signal is supplied from non-coincidence circuit 14, circuit 6 blocks output of test mode control signal 27 to control section 2, or the like. More specifically, since an operator who legally performs a test of this microcomputer 1 must know the contents of program memory 3, a comparison result of comparator 12 represents "coincidence". When the comparison result represents "non-coincidence" a predetermined number of times or more, it is determined that a third party is illegally trying to read program memory 3, and test control signal 27 is not supplied to control section 2 and buffer controller 10. As a result, since the microcomputer cannot be set in a test mode state (an output from control section 2 to internal input/output data bus 22 is set in a high-impedance state), the contents of program memory 3 cannot be read any more.

FIG. 2 shows a connection state when microcomputer 1 having the above arrangement is normally used (i.e., not in a test mode). Microcomputer 1 is connected to external memory 40 through external access signal bus 34, external address data bus 32, and external input/output data bus 31.

A write operation in the case where microcomputer 1 accesses external memory 40 will be described hereinafter. Control section 2 outputs address data for addressing external memory 40 onto internal address bus 21 and outputs a write enable signal (WE) representing that external memory 40 is accessed onto internal access control bus 23. As a result, the write enable signal (WE) is supplied to bi-directional buffer 7 through internal access control bus 23. In addition, access signal decoder 11 receives and decodes address and access control data on internal address bus 21 to generate an external memory enable signal (a signal representing an external memory device to be accessed) and to supply the signal to bi-directional buffer 7 through internal access signal bus 41. Address data for external memory 40 is supplied to bi-directional buffer 8 through internal address bus 21. In addition, when external memory 40 is accessed in a write mode, write data is supplied to bi-directional buffer 9 from control section 2 through internal input/output data bus 22. On the other hand, buffer controller 10 receives access control data representing that external memory 40 is accessed in the write mode through internal access control bus 23. As a result, buffer controller 10 supplies the data to bi-directional buffers 7, 8, and 9 through buffer control signal buses 43, 45, and 47 to control directions of bi-directional buffers 7, 8, and 9 to enable data transfer from the internal to the external bus side. Access, address, and write data are supplied to external memory 40 through external buses 34, 32, and 31, respectively.

FIG. 3 is a block diagram showing a connection state upon a test of microcomputer 1. Microcomputer 1 is connected to test unit 50 through external access signal bus 33, external address data bus 32, external input/output data bus 31, comparison result output external bus 36, and test mode setting signal bus 35.

A test method of program and working memories 3 and 4 will be described below.

First, test unit 50 supplies a test mode setting signal to test mode setting circuit 5 of microcomputer 1 through test mode setting signal bus 35. This test mode setting signal 35 has a specific bit pattern which is known by only a legal operator. Test mode setting circuit 5 compares the bit pattern of input test mode setting signal 35 with the prestored bit pattern. If both patterns do not coincide with each other, test mode signal 25 is not supplied to test mode permission circuit 6. If a coincidence is detected, signal 25 is supplied. Test mode permission circuit 6 determines whether a carry signal is supplied from non-coincidence circuit 14 or not. If the carry signal is not supplied, test control signal 27 is supplied to buffer controller 10 and control section 2. On the other hand, when the carry signal is supplied from non-coincidence circuit 14, test control signal 27 is not supplied to buffer controller 10 and control section 2. Therefore, illegal use by a third party can be prevented. More specifically, when a test mode signal supplied from test mode permission circuit 6 is disabled, buffer controller 10 controls the directions of bi-directional buffers 7, 8, and 9 to enable data transfer from the external to the internal bus side. In addition, tri-state gate 13 is disabled. A case where a program stored in program memory 3 is checked will be described below. In this case, test unit 50 supplies access data representing a read access to bi-directional buffer 7 through external access bus 33, and supplies address data of program memory 3 to be read out to bi-directional buffer 8 through external address data bus 32.

On the other hand, test control signal 27 output from test mode permission circuit 6 is supplied to control section 2 and buffer controller 10. As a result, control section 2 detects that microcomputer 1 is set in a test mode. Then, control section 2 does not supply an active signal to buses 21, 22, and 23. Buffer controller 10 controls the directions of bi-directional buffers 7 and 8 to enable data transfer from the external to the internal bus side. As a result, a test access signal is supplied to access signal decoder 11 and program memory 3 from bi-directional buffer 7 through internal access control bus 23. In addition, address data is supplied to program memory 3 and access signal decoder 11 from bi-directional buffer 8 through internal address bus 21. Access signal decoder 11 generates an access signal in accordance with the supplied access data and supplies the signal to program memory 3. Program data is read out from a designated address in program memory 3. The access signal generated by access signal decoder 11 is supplied to buffer controller 10. Therefore, buffer controller 10 controls to disable buffer 9.

The readout program data is supplied to input terminal A of comparator 12 through internal data bus 22. On the other hand, test unit 50 supplies correct program data to input terminal B of comparator 12 through external input/output data bus 31. Comparator 12 compares the program data supplied to input terminal A with that supplied to input terminal B and supplies the comparison result to test unit 50 through bus driver 13 and comparison external bus 36. As a result, test unit 50 can compare arbitrary data in program memory 33 with the data input from test unit 50 and refer to the comparison result. Therefore, the contents of the data in program memory 3 can be confirmed without being directly output.

The comparison result of comparator 12 is supplied to non-coincidence circuit 14. Non-coincidence circuit 14 counts a non-coincidence signal. When the number of non-coincidence signals reaches a predetermined number, a carry signal is supplied to test mode permission circuit 6. As a result, if non-coincidence continues for a plurality of times, it is determined that a third party is illegally using the microcomputer, and a test mode signal is disabled.

A test method of working memory 4 will be described below.

Test unit 50 supplies test mode setting signal 35 to test-mode setting circuit 5 of microcomputer 1 in the same manner as in program memory 3. Test unit 50 supplies an access signal for working memory 4 to bi-directional buffer 7 through external access bus 33 and supplies address data of working memory 4 to bi-directional buffer 8 through external address bus 32. In addition, test unit 50 supplies write data to working memory 4 to bi-directional buffer 9 through external input/output data bus 31. On the other hand, test control signal 27 is supplied to control section 2 through test mode permission circuit 6. As a result, control section 2 does not supply an active signal to buses 21, 22, and 23. Buffer controller 10 controls the directions of bi-directional buffers 7 and 8 to enable data transfer from the external to the internal bus side. A write access signal for working memory 4 is supplied to access signal decoder 11 and working memory 4 from bi-directional buffer 7 through internal bus 23. A write address for working memory 4 is supplied to working memory 4 from bi-directional buffer 8. Since bi-directional buffer 9 is controlled to enable data transfer from the external to the internal bus side in response to signal 47 from buffer controller 10, write data is supplied to working memory 4. Access signal decoder 11 generates an access signal on the basis of the supplied access data and supplies the signal to working memory 4. As a result, the data supplied from test unit 50 is written in the designated address of working memory 4.

Test unit 50, then, supplies address data and a read access signal to corresponding internal buses 21 and 23 in the same manner as in a write mode. Therefore, read address data is supplied to working memory 4, and read access data is supplied to access signal decoder 11 and working memory 4. Then, access signal decoder 11 supplies an access signal to working memory 4 and buffer controller 10. As a result, buffer controller 10 detects that the read access signal is output from test unit 50, and controls the direction of bi-directional buffer 9 to enable data transfer from the internal to the external bus side. Therefore, the data output from the designated address of working memory 4 is supplied to test unit 50 through external bus 31, thereby reading the data of an arbitrary address of working memory 4. Write and read operations as described above are properly performed by test unit 50, so that working memory 4 can be checked.

A case where an internal access is performed, i.e., control section 2 accesses program memory 3 or working memory 4, will be described hereinafter. In a read mode, control section 2 supplies an address to program memory 3 or working memory 4 through internal address bus 21. In a write mode, write data is supplied to working memory 4. In addition, control section 2 informs that an internal read access or internal write access is performed to access signal decoder 11 through internal access control bus 23. As a result, access signal decoder 11 informs that the internal access is performed to buffer controller 10. Buffer controller 10 controls bi-directional buffers 8 and 9 to disable data transfer between the corresponding external and internal buses so that the address output from control section 2 and the data read out from program or working memory 3 or 4 may not be externally output. As a result, address data output from control section 2 and data output from control section 2 or memories 3 and 4 are not supplied to external memory 40.

If external memory 40 is accessed by control section 2, access signals and address data are supplied to internal buses 21 and 23 from control section 2. Since access signal decoder 11 generates an access signal for external memory 40 on the basis of the access signal and the address data, buffer controller 10 receives the generated access signal and the access signal supplied to internal bus 23, thereby determining that the access is externally performed. Therefore, buffer controller 10 controls the directions of bi-directional buffers 7 and 8 to enable data transfer from the internal to the external bus side. In addition, in a read-access mode, the direction of bi-directional buffer 9 is controlled to enable data transfer from the external to the internal bus side. In a write access-mode, the direction of bi-directional buffer 9 is controlled to enable data transfer from the internal to the external bus side. Therefore, control section 2 can access external memory 40.

As described above, when microcomputer 1 is set in a test mode and program memory 3 is read-accessed, data read out from program memory 3 is not externally output. The readout data is compared with the data from test unit 50 by internal comparator 12, and the comparison result is output to test unit 50, thereby checking the coincidence between both data. Therefore, even if it is set in a test mode, the contents of program memory 3 are not directly and externally output, thereby allowing easy verification of the data by only an operator who knows the program pattern.

What is claimed is:

1. A microcomputer comprising:
    memory means for storing data;
    memory access means for accessing said memory means;
    input/output means for inputting and outputting data from and to a device external to said microcomputer;
    output inhibiting means, connected to said memory means, for inhibiting external output through said input/output means of data derived form an access operation to said memory means;
    access source determining means for determining whether access of said memory means is performed by said memory access means or is externally performed through said input/output means; and
    control means for controlling said output inhibiting means to inhibit external output through said input/output means of said data derived from the access to said memory means when said access source determining determines that the access is performed by said memory access means, and form controlling said output inhibiting means to allow external output through said input/output means of data derived form the access when said access source determining means determines that the access is externally performed.

2. A microcomputer according to claim 1, wherein said output inhibiting means includes a bi-directional buffer responsive to said control means, and internal bus means for connecting said memory means to said bi-directional buffer.

3. A microcomputer according to claim 2, wherein said control means includes means for controlling transfer directions of said bi-directional buffer.

4. A microcomputer according to claim 3, wherein said internal bus means and said input/output means each comprise an access data bus, an address bus, and a data bus, respectively, and said bi-directional buffer is arranged to be coupled with each of said buses.

5. A microcomputer according to claim 1, wherein said memory means comprises a program memory for storing programs and a data memory for storing data, said control means controlling said output inhibiting means so as to block external output through said input/output means of data read out from said program memory when the access is externally performed to said program memory in a read mode, and so as to allow external output of the data read to from said data memory through said input/output means when the access is performed to said data memory in a read mode.

6. A microcomputer according to claim 1, wherein said memory means comprises a program memory for storing programs, and a data memory for storing data, and said output inhibiting means inhibits the read data from being externally output through said input/output means when the contents of said program or data memory are read by said memory access means.

7. A microcomputer comprising:
    memory means for storing data, the memory means including a program memory for storing a program and a data memory for storing data;
    memory access means for accessing said memory means;
    input/output means for inputting and outputting data from and to a device external to said microcomputer;
    output inhibiting means, connected to said memory means, for inhibiting external output through said input/output means of data derived from an access operation to said memory means;
    control means for controlling said output inhibiting means to block external output through said input/output means of data read out from said memory means when said program memory is accessed, and to allow external output of the data read out from said memory means when said data memory is accessed.

8. A microcomputer according to claim 7, wherein said output inhibiting means includes a bi-directional buffer responsive to said control means, and internal bus means for connecting said memory means to said bi-directional buffer.

9. A microcomputer according to claim 8, wherein said control means includes means for controlling transfer directions of said bi-directional buffer.

10. A microcomputer according to claim 9, wherein said internal bus means and said input/output means each comprise an access data bus, an address bus, and a data bus, respectively, and said bi-directional buffer is arranged to be coupled with each of said buses.

11. A system for transferring data comprising:
    a peripheral device capable of receiving and outputting data; and
    a microcomputer comprising:
        memory means for storing data, said memory means including a program memory for storing programs and a data memory for storing data,
        memory access means for accessing said memory means,
        input/output means for inputting and outputting data from and to said peripheral device,
        output inhibiting means, connected to said memory means, for inhibiting external output through said input/output means of data derived from an access operation to said memory means, and
        control means for controlling said output inhibiting means to block external output through said input/output means of said data read out from said memory means when said program memory is accessed, and to allow external of the data read out from said memory means when said data memory is accessed.

12. A system according to claim 11, wherein said peripheral device is a test unit to access said memory means.

13. A microcomputer according to claim 11, wherein said peripheral device is an external memory, and said memory access means accesses said memory means and said external memory means.

14. A system according to claim 11, wherein said peripheral device is an external memory, said control means controlling said bi-directional buffer to disable data transfer when said memory access means accesses said memory means, said control means controlling said bi-directional buffer to enable data transfer from said internal bus means to said input/output means when said memory access means read-accesses said external memory.

15. A microcomputer according to claim 11, wherein said peripheral device is a test unit selectively connected to said microcomputer, said control means controlling said bi-directional buffer to enable data transfer from said input/output means to said internal bus means when said test unit read-accesses said memory means.

16. A system for transferring data comprising:
   a peripheral device capable of receiving and outputting data; and
   a microcomputer comprising:
      memory means for storing data,
      memory access means for accessing said memory means,
      input/output means for inputting and outputting data from and to said peripheral device,
      output inhibiting means, connected to said memory means, for inhibiting external output through said input/output means of data derived from an access operation to said memory means,
      access source determining means for determining whether access of said memory means is performed by said memory access means or is externally performed through said input/output means, and
      control means for controlling said output inhibiting means to inhibit external output through said input/output means of said data derived from said access to said memory means when said access source determining means determines that the access is performed by said memory access means, and for controlling said output inhibiting means to enable external output through said input/output means of data derived from the access when said access source determining means determines that the access is externally performed by said peripheral device.

17. A system according to claim 16, wherein said output inhibiting means includes a bi-directional buffer responsive to said control means, and internal bus means for connecting said memory means to said bi-directional buffer.

18. A system according to claim 17, wherein said control means includes means for controlling transfer directions of said bi-directional buffer.

19. A system according to claim 18, wherein said internal bus means and said input/output means each comprise an access data bus, an address bus, and a data bus, respectively, said bi-directional buffer being arranged to be coupled with each of said buses.

20. A microcomputer according to claim 19, wherein said peripheral device is an external memory, said control means controlling said bi-directional buffer to disable data transfer when said memory access means accesses said memory means, said control means controlling said bi-directional buffer to enable data transfer from said internal bus means to said input/output means when said memory access means read-accesses said external memory.

21. A microcomputer according to claim 19, wherein said peripheral device is a test unit selectively connected to said microcomputer, said control means controlling said bi-directional buffer to enable data transfer from said input/output means to said internal bus means when said test unit read-accesses said memory means.

22. A system according to claim 16, wherein said peripheral device is a test unit to access said memory means.

23. A system according to claim 16, wherein said peripheral device is an external memory and said memory access means accesses said memory and external memory means.

* * * * *